United States Patent
Borghetti et al.

(10) Patent No.: US 8,605,484 B2
(45) Date of Patent: Dec. 10, 2013

(54) SELF-REPAIRING MEMRISTOR AND METHOD

(75) Inventors: Julien Borghetti, Mountain View, CA (US); Alexandre M Bratkovski, Mountain View, CA (US); Matthew D Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 378 days.

(21) Appl. No.: 13/130,822

(22) PCT Filed: Jan. 29, 2009

(86) PCT No.: PCT/US2009/032477
§ 371 (c)(1),
(2), (4) Date: May 24, 2011

(87) PCT Pub. No.: WO2010/087833
PCT Pub. Date: Aug. 5, 2010

(65) Prior Publication Data
US 2011/0261608 A1    Oct. 27, 2011

(51) Int. Cl.
*G11C 11/00* (2006.01)
(52) U.S. Cl.
USPC .......................... 365/148; 365/200; 365/201

(58) Field of Classification Search
USPC .......................... 365/148, 200, 201
See application file for complete search history.

(56) References Cited

U.S. PATENT DOCUMENTS

| | | | |
|---|---|---|---|
| 7,372,065 B2 | 5/2008 | Kozicki et al. | |
| 2003/0141533 A1 | 7/2003 | Nakamura | |
| 2005/0196892 A1 | 9/2005 | Yamagata | |
| 2008/0001172 A1* | 1/2008 | Karg et al. | 257/194 |
| 2008/0239797 A1 | 10/2008 | Tsukamoto | |
| 2011/0228593 A1* | 9/2011 | Strukov | 365/148 |

OTHER PUBLICATIONS

D. Strukov et al., "The missing memristor found," Nature Letters, vol. 453, May 2008, 80-83.
J. Yang et al., "Memristive switching mechanism for metal/oxide/metal nanodevices," Nature Nanotechnology, vol. 3, Jul. 2008, pp. 429-433.

* cited by examiner

*Primary Examiner* — Kretelia Graham

(57) ABSTRACT

A self-repairing memristor and methods of operating a memristor, and repairing a memristor, employ thermal annealing. The thermal annealing removes a short circuit in an oxide layer, of the memristor. Thermal annealing includes heating the memristor, to a predetermined annealing temperature for a predetermined annealing time period. The memristor, returns to an electrically open circuit condition after the short circuit is removed.

15 Claims, 4 Drawing Sheets

SELF-REPAIRING MEMRISTOR AND METHOD

CROSS-REFERENCE TO RELATED APPLICATIONS

N/A

STATEMENT REGARDING FEDERALLY SPONSORED RESEARCH OR DEVELOPMENT

N/A

BACKGROUND

A memristor is a two-terminal electrical device that may function as a passive current limiter in which an instantaneous resistance state is a function of bias history. Specifically, an electrical flux or a time integral of the electric field, between terminals of the memristor is a function of the amount of electric charge, or a time integral of a current, that has passed through the memristor. As such, a memristor represents a two-terminal device that effectively has a memory of its 'state' (e.g. resistance) that is a function of its bias history. Moreover, the bias history is solely dependent on the amount of electric charge that has passed through the device. In other words, a resistance of a memristor may be changed by applying a programming signal to the memristor (e.g., by applying a voltage across the two terminals and passing a current through the memristor), for example.

Notably, memristors may be switched between 'states' (e.g., using the programming signal) and therefore are potentially useful as programmable circuit elements for a variety of memory circuits and related applications. Moreover, the programmed state of the memristor is maintained without power such that memristors may function as inherently non-volatile memory elements. For example, a memristor may be switched by a programming signal between an 'ON' state and an 'OFF' state effectively implementing a binary memory cell or element. In another application, the memristor may be switched or programmed to assume any one of several intermediate states between the ON state and the OFF state using the programming signal. Moreover, the memristor may be used to record and retain an analog level facilitating its use in circuits such as neural networks.

Unfortunately, memristors may occasionally develop a short circuit as a result of being switched between states by the programming signal. The short circuit effectively results in the memristor becoming trapped or stuck in an ON state or condition. Such a 'stuck on' state of a short circuited memristor effectively renders the memristor unusable as a programmable circuit element. Moreover, a short circuited memristor may also interfere with the operation of other memristors. For example, a short circuited memristor connected in parallel with a plurality of other memristors by a common connection (e.g., a bit line) may effectively prevent accessing the other memristors. The short circuit may effectively 'short out' the bit line such that access to individual ones of the other memristors is no longer available, for example.

BRIEF DESCRIPTION OF THE DRAWINGS

Some features of various embodiments of the present invention may be more readily understood with reference to the following detailed description taken in conjunction with the accompanying drawings, where like reference numerals designate like structural elements, and in which.

Certain embodiments of the present invention have other features that are one of in addition to and in lieu of the features illustrated in the above-referenced figures. These and other features of the invention are detailed below with reference to the preceding drawings.

DETAILED DESCRIPTION

Embodiments of the present invention facilitate removing a short circuit in a memristor. Removing the short circuit may effectively heal or repair the memristor, according to some embodiments. In particular, the short circuit that is removed is a short circuit in an oxide of the memristor that is effectively electrically non-reversible. Such an electrically non-reversible short circuit, also sometimes referred to as a 'stuck-ON' condition of a memristor, is a short circuit that cannot be removed using a programming signal applied to or across terminals of the memristor. The electrically non-reversible short circuit may be a result of or induced by switching the memristor between states, for example during operation of the memristor. As such, in some embodiments, the electrically non-reversible short circuit may be also referred to as a switching-induced short circuit.

According to various embodiments of the present invention, the short circuit is removed from the memristor and an open circuit condition is established. In some embodiments, the memristor is rendered fully operational once the short circuit is removed. In other embodiments, the memristor is effectively non-operational but remains in the open circuit condition as a result of removing the short circuit. In general, any data stored by the memristor is erased and the memristor is effectively 'reset' by removing the short circuit, according to various embodiments of the present invention.

Figure 1:
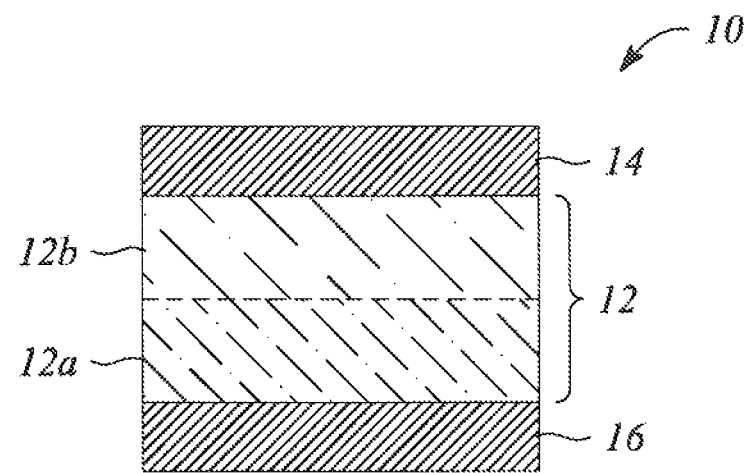
FIG. 1 illustrates a cross sectional view of an exemplary memristor, according to an embodiment of the present invention.

FIG. 1 illustrates a cross sectional view of an exemplary memristor 10, according to an embodiment of the present invention. The memristor 10 is a two terminal device that comprises an oxide layer 12 disposed between a first or 'top' electrode 14 and a second or 'bottom' electrode 16. The first and second electrodes 14, 16 facilitate applying the programming signal to affect a change in the oxide layer 12. The change in the oxide layer 12 produced by the programming signal may be understood in terms of oxygen migration within the oxide layer 12. For example, a boundary between a layer of oxide 12b that is deficient in oxygen and another effectively 'normal' oxide layer 12a (i.e., oxide that is not oxygen deficient) may move as a result of exposure to the programming signal. The movement of the boundary may result from oxygen migration under the influence of the programming signal, for example. A final location of the movable boundary may establish the 'programmed' resistance of the memristor 10, for example.

In some embodiments, the oxide layer 12 is a thin film layer having a thickness on the order of several tens of nanometers. For example, the oxide layer 12 may have a thickness between about 10 nanometers (nm) to about 100 nm. In another example, the thin film oxide layer 12 may be between about 20 nanometer (nm) and about 50 nm thick.

In some embodiments, the oxide layer 12 may be literally sandwiched between the first electrode 14 and the second electrode 16 (as illustrated in FIG. 1). In other embodiments (not illustrated), the first electrode and the second electrode may be next to one another on a surface of the oxide layer (e.g., a planar oxide). In these embodiments, the oxide layer of the memristor is a portion of the oxide generally under and stretching between the electrodes. However, for simplicity of discussion herein, all portions of the oxide layer that are operationally involved in the functionality of the memristor, whether or not the oxide layer portions are strictly located 'between' the electrodes. will be considered to be the 'oxide layer disposed between a first electrode and a second electrode,' or equivalently is the 'oxide layer' of the memristor herein.

The oxide layer 12 of the memristor 10 may be effectively any oxide that can be formed into a layer between a pair of electrodes. For example, titanium oxide may be used as the oxide layer in a memristor. Other oxides that may be employed include, but are not limited to, nickel oxide, nickel oxide doped with chromium, strontium titanium oxide, strontium titanium oxide doped with chromium, and tungsten oxide.

In some embodiments, the oxide layer 12 may comprise a crystalline oxide. In some of these embodiments, the crystalline oxide may be mono-crystalline. In other embodiments, the oxide layer 12 comprises an amorphous oxide. In yet other embodiments, the oxide layer comprises either a nanocrystalline oxide or a microcrystalline oxide. A nanocrystalline oxide is an oxide that includes or comprises a plurality of nano-scale crystallites while a microcrystalline oxide may include crystallites having sizes in the micron range, for example. In some embodiments, the oxide layer may comprise a plurality of layers. A first layer of the plurality may be a normal oxide (e.g., $TiO_2$) while a second layer may be an oxygen depleted or oxygen deficient oxide layer (e.g., $TiO_{2-x}$ where '2–x' denotes an oxygen deficit, where x is greater than 0 and less than about 2). For example, the oxygen deficient $TiO_{2-x}$ may have values of x that are greater than about $10^{-5}$ and less than about $10^{-2}$. In another example, the oxygen deficient may have a value of x that ranges up to about 1.

An oxygen deficient oxide layer may be produced by exposing a surface of the oxide layer (e.g., $TiO_2$) to a gas mixture of 95% nitrogen ($N_2$) and 5% hydrogen ($H_2$) at a temperature of about 550 degrees C. for about 2 hours, for example. The gas mixture effectively removes oxygen from the oxide layer leaving the oxygen deficient oxide layer in a portion of the oxide layer near the surface. The oxygen deficient layer may have 'oxygen vacancies' that may act as n-type dopants within the oxide layer. The presence of these oxygen vacancies may allow the oxide layer to function in a manner similar to an n-doped semiconductor, for example.

The first and second electrodes 14, 16 comprise a conductor. For example, the first electrode and the second electrode may comprise a metal. The metal may be platinum (Pt) for example. Other metals and other conductors may also be employed as the first electrode and the second electrode, respectively, according to various embodiments. Additionally, the first and second electrodes may comprise more than one layer. For example, a layer of Ti may be employed between a Pt-based electrode and a $TiO_2$ oxide layer. The Ti layer may assist in providing an oxygen deficient layer (i.e., $TiO_{2-x}$) in the oxide layer, for example.

As mentioned above, a short circuit may occur in a memristor as a result of switching the memristor between various states (e.g., between an ON state and an OFF state). For example, a channel or filament that is deficient in oxygen may form in the oxide layer while using the programming signal to switch the memristor during operation. The oxygen deficient channel becomes a short circuit when the channel connects the first electrode and the second electrodes to one another. The short circuit renders the memristor inoperable. That is, the memristor no longer responds to an applied voltage and current in a manner consistent with normal memristor operation. The memristor is referred to as being in a 'stuck on' condition and so the short circuit may be termed a 'stuck on' defect. The short circuit generally cannot be removed or cleared by applying the conventional programming signal. As such, the short circuit, or switching-induced short circuit, is termed 'electrically non-reversible', as mentioned above. Furthermore, a block of a memory element in which multiple memristor cells are connected to a common bit line may be rendered inoperable by a single memristor in the block with a short circuit through the oxide of the single memristor.

According to some embodiments of the present invention, thermal annealing of the oxide layer may be employed to remove the short circuit. In particular, thermal annealing in which the oxide layer of the memristor is heated may result in the clearing of the so-called channel or filament such that the memristor returns to an open circuit or 'open' condition. In some embodiments, thermal annealing removes the short circuit and returns the memristor to an operational condition. For example, after annealing, the previously shorted memristor is once again as programmable as it was before the short circuit formed. in other embodiments, thermal annealing removes the short circuit leaving the memristor in an open condition but unprogrammable. in particular, the memristor may not be switchable once the open circuit condition is established after thermal annealing. Moreover, memristors that do not have a short circuit through the oxide layer continue to operate normally after thermal annealing, according to embodiments of the present invention. In particular, normal operation of non-shorted memristors after thermal annealing has been experimentally verified.

Thermal annealing comprises heating the oxide layer to a predetermined annealing temperature. As defined herein, a predetermined annealing temperature is a temperature above a maximum temperature that an operational device containing the memristor would normally experience (e.g., greater than about 250 degrees C.). In some embodiments, the predetermined annealing temperature is above about 300 degrees C. In some embodiments, the predetermined annealing temperature is above about 350 degrees C. For example, an annealing temperature of approximately 320 degrees C. is employed. In another example, an annealing temperature of approximately 380-400 degrees C. may be employed. In some embodiments, the annealing temperature is less than about 600 degrees C.

In some embodiments, the thermal annealing at the predetermined annealing temperature is performed for a predetermined annealing time period. In general, an annealing time depends on one or more of an extent or size of the channel or filament, a particular predetermined annealing temperature and means for thermally annealing. In some embodiments, the predetermined annealing time period is less than about 5 minutes. For example, thermal annealing for a predetermined annealing time period of about 1 second may remove a short circuit from a memristor when a predetermined annealing temperature is about 350 degrees C. In another example, the predetermined annealing time period may be on the order of tens of milliseconds (ms) or even less (e.g., <10 ms). The predetermined annealing time period need only be sufficient in length to disconnect the channel or filament from one of the electrodes to effectively remove the short circuit and heal the memristor, for example.

The thermal annealing may remove the short circuit by promoting a redistribution of oxygen within the oxide layer, for example. For example, thermal annealing may induce oxygen that diffused from a region of the oxide layer comprising the channel or filament to diffuse back into that region. As the oxygen diffuses back into the region of the channel or filament that formed the oxygen deficient short circuit, the short circuit is removed. In addition, the thermal annealing may result in a reformation of a crystallinity of the oxide that may further reduce the conductivity and assist in the removal of the short circuit.

Figure 2:
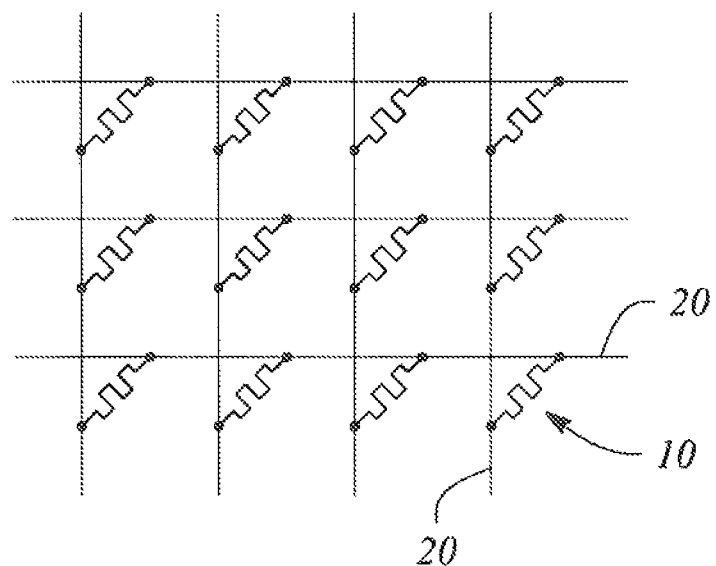
FIG. 2 illustrates a schematic diagram of an exemplary memristor-based memory circuit, according to an embodiment of the present invention.

Embodiments of the present invention are applicable to a wide variety of memristor-based circuits. For example, an array of memristors 10 may be provided as a memory circuit. FIG. 2 illustrates a schematic diagram of an exemplary memristor-based memory circuit, according to an embodiment of the present invention. For example, the exemplary memristor-based memory circuit illustrated in FIG. 2 may be implemented as a 'cross-bar' array. As illustrated, rows of memristors 10 are connected together with a common conductor referred to as a 'bit line' 20. Another bit line 20 connects columns of memristors 10. Parallel bit lines 20 may be implemented as parallel conductor traces on a substrate, for example. Memristors 10 may be formed by separating perpendicularly oriented bit lines 20 with an oxide layer at intersections or cross points within the cross-bar array. Note that herein, any connection (e.g., conductor trace) that allows a programming signal to be applied to the memristor 10 is generally referred to as a bit line, whether or not the connection is a common connection between a plurality of memristors.

For simplicity herein, no distinction is made between the terms 'layer' and 'layers' unless such distinction is necessary for proper understanding. Similarly, unless the difference is important for proper understanding, no distinction is made between a substrate and a substrate with layers formed on the surface or within the substrate. Further, as used herein, the article 'a' is intended to have its ordinary meaning in the patent arts, namely 'one or more'. For example, 'a layer' generally means one or more layers and as such, 'the layer' means 'the layer(s)' herein. Also, any reference herein to 'top', 'bottom', 'upper', 'lower', 'up', 'down', 'left' or 'right' is not intended to be a limitation herein. Furthermore, terms such as 'about' and 'approximately' generally refer to a tolerance of +/−10% about a value to which the term is applied unless otherwise specified herein. Moreover, examples herein are intended to be illustrative only and are presented for discussion purposes and not by way of limitation.

Figure 3:
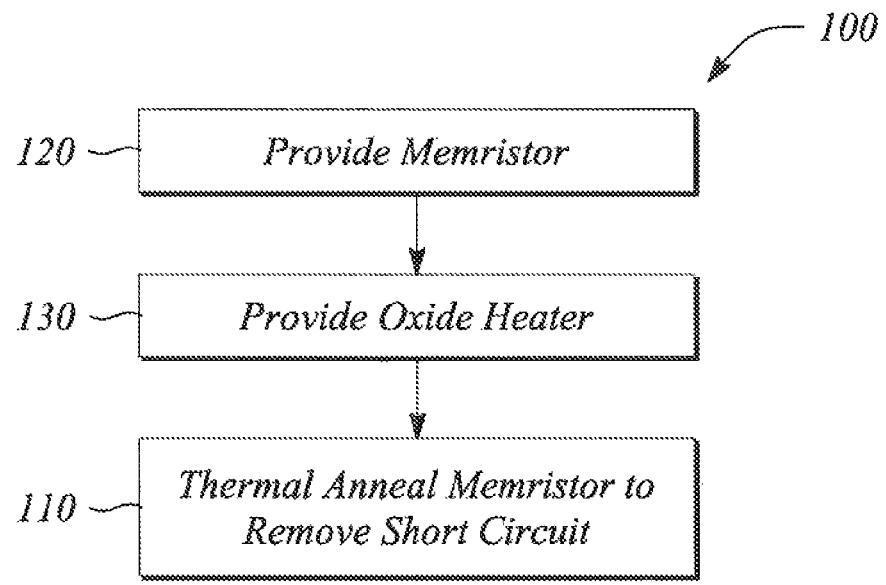
FIG. 3 illustrates a flow chart of a method of repairing a memristor, according to an embodiment of the present invention.

FIG. 3 illustrates a flow chart of a method 100 of repairing a memristor, according to an embodiment of the present invention. In particular, the method 100 of repairing a memristor mitigates or removes a short circuit from an oxide layer of the memristor. Removing the short circuit returns the memristor to an electrically open circuit condition from a short circuited condition. Specifically, according to the method 100 of repairing the memristor, the short circuit is replaced by an open circuit to effectively return the memristor to an open circuit condition.

In some embodiments, the memristor is a component of an operational device and the short circuit removal according to the method 100 is performed on the memristor in situ. By 'in situ' it is meant that the short circuit removal is performed while the memristor is in the operational device as opposed to during fabrication of the memristor. Moreover, 'in situ' means that the removal of the short circuit according to the method 100 is performed after both the memristor and the device are rendered operational following manufacturing of the device. In other words, the method 100 of repairing a memristor operates on a memristor in a device after the device is capable of operating (i.e., after fabrication is completed), or after the device is operational, depending on the embodiment.

For example, an operational device may comprise a memory circuit and the memristor may be a memory cell of the memory circuit. In the operational device, the exemplary memory circuit is capable of storing information using the memristor-based memory cell. In other words, the memristor can be switched between a plurality of states or conditions. In some embodiments, a short circuit may be caused by switching the memristor between a plurality of states or conditions (e.g., switching between ON and OFF). The various states of the plurality may represent data being stored by the memristor-based memory cell of the exemplary operational device, for example. Switching may be accomplished using a programming signal within the operational device, for example. Such a short circuit that results from switching the memristor using the programming signal is referred to herein as a 'switching-induced' short circuit. The method 100 of repairing a memristor may remove the switching-induced short circuit and return the exemplary memristor-based memory cell to an open condition in the exemplary memory circuit of the operational device, for example.

The method 100 of repairing a memristor comprises thermal annealing 110 the memristor to remove the short circuit in the oxide layer of the memristor. Thermal annealing 110 comprises heating the memristor, or more specifically heating the oxide layer of the memristor, to a predetermined annealing temperature for a predetermined annealing time period. The predetermined annealing temperature and predetermined annealing time period are selected to facilitate removal of the short circuit.

In some embodiments, thermal annealing 110 comprises heating the memristor to a predetermined annealing temperature above about 300 degrees C. For example, the predetermined annealing temperature may be 300 degrees C. with a tolerance of +/−10 degrees C. in other example, the predetermined annealing temperature may be in a range from about 300 degrees C. to about 350 degrees C. In some embodiments, thermal annealing comprises heating the memristor to a predetermined annealing temperature of above about 350 degrees C. For example, the predetermined annealing temperature may be between 350 degrees C. and about 400 degrees C. In general, the predetermined annealing temperature is low enough to avoid damaging either the memristor, or in the case of in situ repair, a device containing the memristor.

In some embodiments, thermal annealing 110 is performed for a predetermined annealing time period. In general, the predetermined annealing time period is a time period that is determined to be sufficient to remove the short circuit given a predetermined annealing temperature. In some embodiments, removal of the short circuit may be directly detected and used to establish the predetermined annealing time period. For example, a resistance across the memristor may be monitored during thermal annealing 110 at the predetermined annealing temperature. When the resistance is seen to increase above the level of the short circuit, the thermal annealing 110 may be terminated. The time required to see an increase in the resistance is the predetermined annealing time period, for example.

In some embodiments, the predetermined annealing time period is less than about 5 minutes. For example, the predetermined annealing time period may be about 1-2 minutes. In some embodiments, the predetermined annealing time period may be less than about 1 second. For example, thermal annealing 110 may be performed for a predetermined annealing time period of between about 10 ms and 100 ms. In some embodiments, the predetermined annealing time period may be less than 10 ms. In yet other embodiments, other time periods greater than 5 minutes may be used for thermal annealing 110 as the predetermined annealing time period. For example, the other time periods may depend on a heating capacity of an employed heat source to heat the memristor to the predetermined annealing temperature.

In some embodiments, thermal annealing 110 comprises illuminating the short circuited memristor with an ultraviolet (UV) light. The UV light may be absorbed by and thus heat the oxide layer of the memristor, according to some embodiments. For example, thermal annealing 110 may be performed by illuminating the memristor using UV light having an intensity of about 10-50 milliwatts (mW) per centimeter (cm) for about one (1) second (i.e., a predetermined annealing time period). Such an exposure to UV light has been shown to provide a predetermined annealing temperature sufficient to remove a switching-induced short circuit from an exemplary memristor.

In some embodiments, thermal annealing 110 comprises using an electric current flowing through an electrical resistor to heat the memristor to the predetermined annealing temperature. In some of these embodiments, the electrical resistor may comprise a conductive bit line or similar conductor of a circuit containing the memristor. Specifically, a finite resistance of the bit line may function as the electrical resistor that is employed for thermal annealing 110. Current applied to and flowing in the bit line may heat the memristor, for example. In another example, the current may flow through the bit line and into the memristor. In this example, the short circuit of the memristor may act as the 'electrical resistor' instead of or in addition to the resistance of the bit line.

In other embodiments that employ current flowing through an electrical resistor to provide the thermal annealing 110, the electrical resistor is a resistor embedded in a circuit layer adjacent to the memristor. In particular, the electrical resistor may be a resistive heater in a circuit layer of a circuit that contains the memristor. For example, the circuit layer may be a layer that is one or both of above or below the memristor, for example.

In some embodiments, the method 100 of repairing a memristor further comprises providing 120 the memristor. The provided 120 memristor comprises a first electrode and a second electrode. The oxide layer is disposed between the first electrode and the second electrode. The memristor may be provided 120 in an operational device, according to some embodiments. In these embodiments, thermal annealing 110 is performed in situ on the provided 120 memristor.

In some embodiments, the method 100 of repairing further comprises providing 130 an oxide heater. The oxide heater is used to heat the oxide layer of the provided 120 memristor during thermal annealing 110. In particular, the oxide heater provides sufficient heat to achieve the predetermined annealing temperature for the predetermined annealing time period, according to embodiments of the present invention. As such, by definition herein, the oxide heater is a heater that can provide sufficient heat (i.e., to achieve the predetermined annealing temperature) for a sufficient period of time (i.e., the predetermined annealing time period) to the oxide layer of the memristor to remove the short circuit.

In some embodiments, providing 130 an oxide heater comprises providing an ultraviolet (UV) light source that illuminates the oxide layer of the memristor with UV light. The UV light heats the oxide layer of the memristor. In some embodiments, the UV light is of sufficient intensity to heat the oxide layer of the memristor to the predetermined annealing temperature and for the predetermined annealing time period. In other embodiments, the UV light is employed in conjunction with another means for heating the memristor. In such embodiments, the UV light may have an intensity that is insufficient to perform thermal annealing 110 in the absence of the other means, for example.

In some embodiments, providing 130 an oxide heater comprises providing a resistive heater in a circuit layer of the operational device adjacent to the memristor. In some embodiments, the resistive heater heats the oxide layer of the memristor to the predetermined annealing temperature for the predetermined annealing time period. In other embodiments, the restive heater is assisted by another means of heating during thermal annealing 110 to remove the short circuit from the memristor.

In some embodiments, providing 130 an oxide heater comprises providing a current source. The provided current source sources current through a bit line connected to the memristor. In some of these embodiments, the current flowing through a resistance of the bit line heats the oxide layer of the memristor. In some embodiments, the current flowing through a resistance of the short circuit of the memristor heats the oxide layer of the memristor. In other embodiments, heating the oxide layer of the memristor is provided by the current flowing through a combination of the resistance of the bit line and a resistance of the short circuit. In yet other embodiments, heating the oxide layer of the memristor is provided by another means in addition to the heating provided by the current flowing through the resistance of one or both of the bit line and the short circuit. Whatever combination of heating that is used (e.g., by one or more of the UV light, the resistive heater and the current flowing through a resistance) according to the various embodiments, the oxide layer is heated to the predetermined annealing temperature for the predetermined annealing time period during thermal annealing 110.

Figure 4:
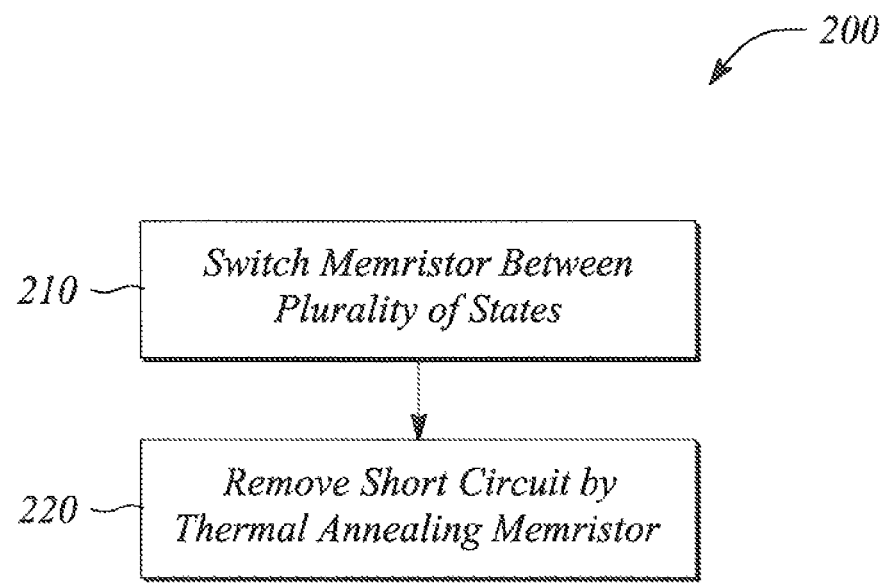
FIG. 4 illustrates a flow chart of a method of operating a memristor, according to an embodiment of the present invention.

FIG. 4 illustrates a flow chart of a method 200 of operating a memristor, according to an embodiment of the present invention. The method 200 of operating a memristor effectively repairs a switching-induced short circuit in the memristor. The repaired memristor is a memristor that is returned to an open circuit condition after removing the switching-induced short circuit, according to various embodiments of the method 200 of operating a memristor.

As illustrated in FIG. 4, the method 200 of operating a memristor comprises switching 210 a memristor between a plurality of states by applying a programming signal to a memristor. For example, the memristor may be switched between an ON state and an OFF state during switching 210. In another example, the plurality of states may include the ON and OFF states as well as several intermediate states between ON and OFF. In some embodiments, switching may induce a 'switching induced' short circuit in the memristor during operating the memristor. For example, the switching may result in formation of a channel or filament of oxygen deficient oxide within the oxide layer of the memristor. The channel may stretch between and connect electrodes of the memristor to produce the switching-induced short circuit, for example. In other embodiments, a short circuit may be induced in the memristor during operation in a way other than by switching the memristor, or other than by switching alone. Without subscribing to any particular theory, it appears that the short circuit may form in the memristor during operation for the purposes of the various embodiments herein.

The method 200 of operating a memristor further comprises removing 220 the short circuit by thermal annealing the memristor. In particular, in some embodiments, removing 220 the short circuit by thermal annealing comprises heating the memristor to a predetermined annealing temperature above about 300 degrees. The heating may further be performed for a predetermined annealing time period such as, but not limited to, less than about 1 second. In some embodiments, removing 220 the short circuit by thermal annealing may be the same as the thermal annealing 110 described above with respect to the method 100 of repairing a memristor.

In some embodiments, the memristor being switched 210 is a member of a plurality of memristors organized in a plurality of blocks. In such embodiments, each block may comprise a subset of the plurality of memristors, for example. Further, the memristor being switched 210 is located in and is a member of a selected one of the blocks. For example, the memristor may be a memory cell in a memory circuit, wherein the memory circuit is divided into a plurality of memory blocks. In some of these embodiments, removing 220 the short circuit by thermal annealing the memristor comprises selectively heating the selected one of the blocks that contains the switched memristor having the short circuit. Since thermally annealing a block of memristors effectively erases all of the data stored by the block, selectively heating the selected block with the short circuited memristor may facilitate retaining most of the memory stored in the memory circuit, for example.

In some embodiments of the present invention, a self-repairing memristor is provided. The self-repairing memristor is capable of removing a short circuit in an oxide layer of the memristor. By removing the short circuit, the memristor is returned to an open circuit condition. In some embodiments, the self-repairing memristor is returned to an operational (i.e., programmable) condition by removal of the short circuit. In some embodiments, the removed short circuit is a switching-induced short circuit.

Figure 5:
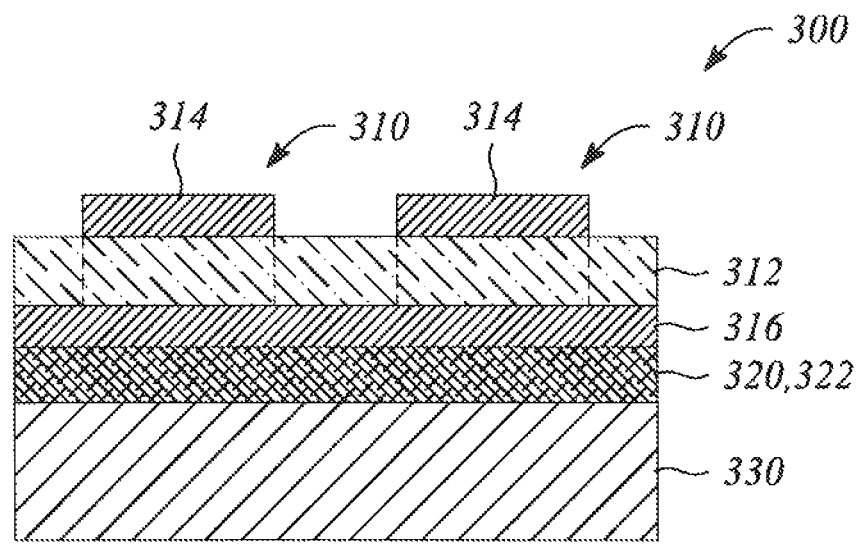
FIG. 5 illustrates a cross sectional view of a self-repairing memristor, according to an embodiment of the present invention.
Figure 6:
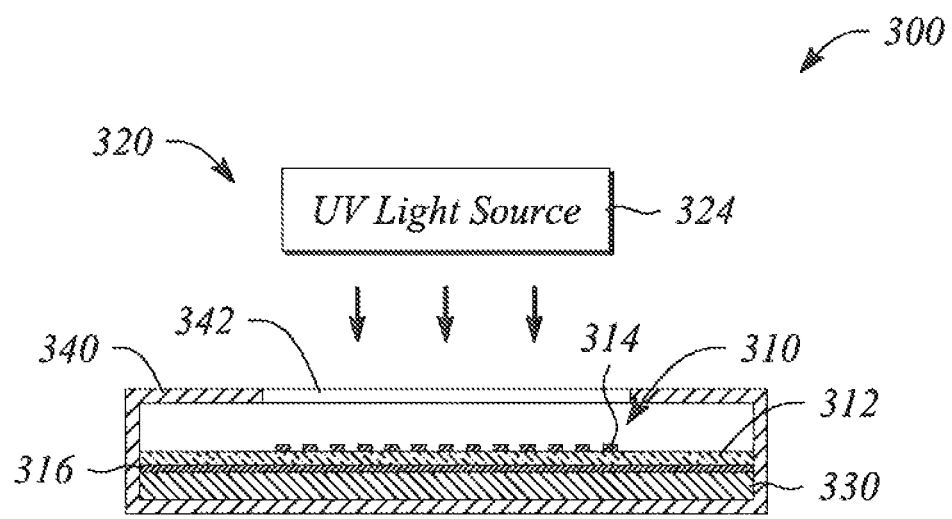
FIG. 6 illustrates a cross sectional view of a self-repairing memristor, according to another embodiment of the present invention.
Figure 7:
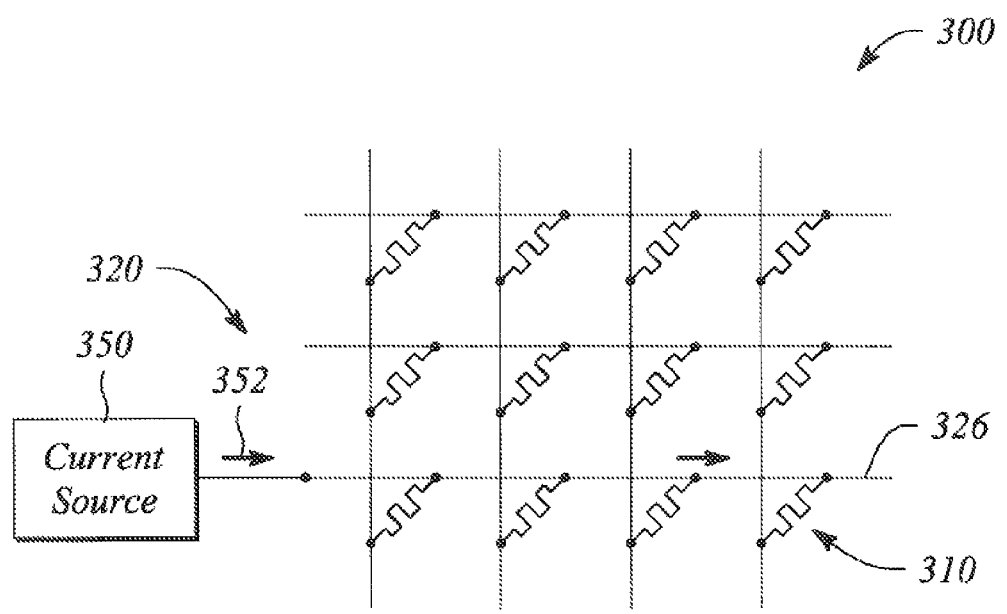
FIG. 7 illustrates a block diagram of a self-repairing memristor, according to another embodiment of the present invention.

FIG. 5 illustrates a cross sectional view of a self-repairing memristor 300, according to an embodiment of the present invention. FIG. 6 illustrates a cross sectional view of a self-repairing memristor 300, according to another embodiment of the present invention. FIG. 7 illustrates a schematic block diagram of a self-repairing memristor 300, according to another embodiment of the present invention.

As illustrated in FIGS. 5-7, the self-repairing memristor 300 comprises a memristor 310. Specifically, as illustrated in FIG. 5, the memristor 310 comprises an oxide layer 312 disposed between a first electrode 314 and a second electrode 316. In particular, the first electrode 314 is illustrated above the oxide layer 312 while the second electrode 316 is below the oxide layer 312 and the first electrode 314, as illustrated. For example, the memristor 310 may be a memristor of a cross-bar array where the first electrode 314 is a top bit line of the cross-bar array running perpendicular to a plane of the FIG. 5 drawing. Likewise, the second electrode 316 may be a bottom electrode of the cross-bar array running parallel to the FIG. 5 drawing plane, for example. The oxide layer 312 may be an oxide layer that separates the first electrode 314 from the second electrode 316 where the electrodes 314, 316 cross one another. Vertical dashed lines in FIG. 5 illustrate an approximate extent of a cross point of the electrodes 314, 316 and the oxide layer 312 that effectively forms the memristor 310.

It should be noted that the memristor 300 illustrated in FIG. 5 is depicted as having an exemplary vertical or stacked configuration. The illustrated stacked configuration is for discussion purposes only, and not by way of limitation. In particular, the discussion herein applies equally to any of a variety of other memristor configurations (not illustrated) with varying arrangements of the oxide layer and the respective first and second electrodes.

In some embodiments, the memristor 310 may experience a short circuit (not illustrated). The short circuit may be a switching-induced short circuit, for example. The short circuit experienced by the memristor 310 may be an oxygen deficient filament or channel that extends from the first electrode 314 to the second electrode 316 through the oxide layer 312 of the memristor, in some embodiments.

The self-repairing memristor 300 illustrated in FIGS. 5-7 further comprises an oxide heater 320. The oxide heater 320 acts as a heat source to heat the memristor 310. In particular, the oxide heater 320 facilitates heating the memristor 310 to a predetermined annealing temperature for a predetermined annealing time period. Since by definition defined herein, a predetermined annealing temperature is a temperature above a maximum temperature that an operational device containing the memristor, the oxide heater 320 is clearly different and distinct from a heater used to maintain an operational temperature of a device, for example.

In some embodiments, the oxide heater 320 provides sufficient heating to achieve and maintain a predetermined annealing temperature in the memristor above about 300 degrees C. In other embodiments, the predetermined annealing temperature provided by the oxide heater 320 is the same as any of the predetermined annealing temperatures described above.

The predetermined annealing time period is a time period at the predetermined annealing temperature selected to remove the short circuit in the memristor 310. As such, the predetermined annealing time period may be effectively any time period determined to remove the short circuit. For example, the predetermined annealing time period may be less than about 1 second. In other examples, the predetermined annealing time period may be any of the predetermined annealing time periods described above.

According to some embodiments, the oxide heater 320 may comprise a resistive heater 322 in a circuit layer adjacent to the memristor 310. In particular, referring to FIG. 5, the memristor 310 may be integrated in a multilayer circuit on a substrate 330. The resistive heater 322 may comprise a circuit layer below the memristor 310, for example. When the resistive heater 322 is energized, heat generated is conducted up to the oxide layer 312, for example. In another example (not illustrated), the circuit layer of the resistive heater may be located above memristor 310. In yet another example (also not illustrated), the resistive heater may be located beside the memristor 310 in the same circuit layer as the memristor 310. In some embodiments, the resistive heater 322 may be located in the self-repairing memristor 300 such that the resistive heater 322 may heat a single memristor 310, while in other embodiments, the resistive heater 322 may heat a plurality of adjacent memristors 310, for example all at once or one at a time.

Referring to FIG. 6, in some embodiments, the self-repairing memristor 300 further comprises a package 340 with a UV transmissive window 342. In some of these embodiments, the oxide heater 320 comprises an ultraviolet (UV) light source 324 that illuminates the memristor 310 through the UV transmissive window 342. The illuminated memristor 310 is heated by the UV light from the UV light source 324 at the predetermined temperature and for the predetermined time period.

Referring to FIG. 7, in some embodiments, the self-repairing memristor 300 further comprises a current source 350. The current source 350 provides an electrical current 352 that may be one or both of an alternating current (AC) or a direct current (DC). For example, the electrical current 352 may be an AC current with a DC offset. In some of these embodiments, the current source 350 may be connected to a bit line 326 of the memristor 310. Reference to a 'bit line' herein generally means any connection to the memristor such as a conductor trace used to one or both of write to and read from the memristor. For example, the bit line 326 may be a bit line in a memory circuit having a plurality of memristors 310 (e.g., a cross point memory array). The current source 350 supplies the electrical current 352 to the oxide heater 320 to heat the memristor 310.

In some embodiments having the current source 350, the oxide heater 320 comprises the bit line 326. The current source 350 supplies the electrical current 352 to the bit line 326 that, in turn, heats the memristor 310. For example, a resistance of the bit line 326 may interact with the sourced electric current 352 flowing in the bit line 326 to heat the memristor 310. In some embodiments, the oxide heater 320 comprises the short circuit in memristor 310. In such embodiments, a resistance of the short circuit effectively interacts with the electric current 352 flowing through the short circuit to heat the memristor 310.

In other embodiments (not illustrated in FIG. 7), the electric current from the current source may be used to energize the oxide heater realized as a resistive heater in a circuit layer adjacent to the memristor (e.g., as illustrated in FIG. 5). In some embodiments, the self-repairing memristor 300 may comprise a combination of the above-described embodiments of the oxide heater 320, for example. In some of these embodiments, the self-repairing memristor 300 may comprise both the package 340 with a UV transparent window 342 and a current source 350, both of which may be involved in heating the memristor 310 to remove the short circuit from the memristor 310.

Thus, there have been described embodiments of methods of repairing and operating a memristor and a self-repairing memristor that employ thermal annealing to remove a short circuit from the memristor. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of repairing a memristor, the method comprising:
    thermal annealing the memristor, to remove a short circuit in an oxide layer, of the memristor, thermal annealing comprising heating the memristor, to a predetermined annealing temperature for a predetermined annealing time period,
    wherein removing the short circuit returns the memristor, from a short circuited condition to an electrically open circuit condition.

2. The method of repairing a memristor, of claim 1, wherein thermal annealing is performed on the memristor, in situ in an operational device.

3. The method of repairing a memristor, of claim 1, further comprising:
    providing the memristor, the memristor, comprising a first electrode, a second electrode, and the oxide layer, disposed between the first electrode, and the second electrode; and
    providing an oxide heater, the oxide heater being used to heat the oxide layer, of the provided memristor, during thermal annealing.

4. The method of repairing a memristor, of claim 3, wherein providing an oxide heater comprises one or more of:
    providing an ultraviolet (UV) light source that illuminates the oxide layer, of the memristor, with UV light, the UV light heating the oxide layer, of the memristor;
    providing a resistive heater in a circuit layer adjacent to the memristor, of an operational device that comprises the memristor, the resistive heater heating the oxide layer, of the memristor; and
    providing a current source that sources current through a bit line connected to the memristor, the current flowing through a resistance of one or both of the bit line, and the short circuit heating the oxide layer, of the memristor,
    wherein heating by one or more of the UV light, the resistive heater and the current flowing through a resistance heats the oxide layer, to the predetermined annealing temperature for the predetermined annealing time period during thermal annealing.

5. The method of repairing a memristor, of claim 1, wherein the predetermined annealing temperature used during thermal annealing is a temperature above about 350 degrees Celsius (C).

6. The method of repairing a memristor, of claim 1, wherein thermal annealing comprises illuminating the memristor, with ultraviolent light, the UV light heating the oxide layer, of the memristor, to the predetermined annealing temperature.

7. The method of repairing a memristor, of claim 1, wherein thermal annealing comprises using an electric current flowing through an electrical resistor to heat the memristor, to the predetermined annealing temperature, the electrical resistor comprising one or more of a bit line, of a circuit of an operational device that comprises the memristor, and a resistor of a resistive heater embedded in a circuit layer adjacent to the memristor, within the operational device.

8. A method of operating a memristor, the method comprising:
    switching a memristor, between a plurality of states by applying a programming signal to the memristor, wherein switching induces a short circuit in the memristor; and
    removing the switching-induced short circuit by thermal annealing the memristor,
    wherein the memristor, is returned to an open circuit condition after removing the switching-induced short circuit.

9. The method of operating a memristor, of claim 8, wherein removing the switching-induced short circuit by thermal annealing comprises heating the memristor, to a predetermined annealing temperature above about 300 degrees.

10. The method of operating a memristor, of claim 8, wherein the memristor, being switched is a member of a plurality of memristors organized in a plurality of blocks, each block comprising a subset of the plurality of memristors, the switched memristor, being in a selected one of the blocks, and wherein removing the short circuit by thermal annealing the memristor, comprises selectively heating the selected one of the blocks.

11. A self-repairing memristor comprising:
   a memristor, comprising an oxide layer, between a first electrode, and a second electrode, the memristor, having a short circuit through the oxide layer, between the first electrode, and the second electrode, of the memristor; and
   an oxide heater that heats the memristor, to a predetermined annealing temperature above about 300 degrees C. for a predetermined annealing time period, the predetermined annealing time period being selected to remove the short circuit.

12. The self-repairing memristor of claim 11, wherein the oxide heater comprises a resistive heater in a circuit layer adjacent to the memristor.

13. The self-repairing memristor of claim 11, further comprising a package with a UV transmissive window, wherein the oxide heater comprises an ultraviolet light source that illuminates the memristor, through the UV transmissive window, the illuminated memristor, being heated by the UV light to the predetermined annealing temperature.

14. The self-repairing memristor of claim 11, further comprising a current source connected to a bit line, of the memristor, the current source supplying an electrical current to the oxide heater to heat the memristor, wherein the oxide heater comprises the bit line, a resistance of the bit line, interacting with the sourced electric current flowing in the bit line, to heat the memristor, to the predetermined annealing temperature.

15. The self-repairing memristor of claim 11, further comprising a current source connected to a bit line, of the memristor, the current source supplying an electrical current to the oxide heater to heat the memristor, wherein the oxide heater comprises the short circuit in the memristor, a resistance of the short circuit interacting with the electric current flowing through the short circuit to heat the memristor, to the predetermined annealing temperature.

* * * * *

UNITED STATES PATENT AND TRADEMARK OFFICE
CERTIFICATE OF CORRECTION

PATENT NO. : 8,605,484 B2
APPLICATION NO. : 13/130822
DATED : December 10, 2013
INVENTOR(S) : Julien Borghetti et al.

Page 1 of 1

It is certified that error appears in the above-identified patent and that said Letters Patent is hereby corrected as shown below:

In the Claims:

In column 12, line 18, in Claim 4, after "ultraviolet" delete "(UV)".

Signed and Sealed this
Thirteenth Day of May, 2014

Michelle K. Lee
*Deputy Director of the United States Patent and Trademark Office*